(12) United States Patent
Lee et al.

(10) Patent No.: US 7,399,672 B2
(45) Date of Patent: Jul. 15, 2008

(54) METHODS OF FORMING NONVOLATILE MEMORY DEVICES

(75) Inventors: Chang-Hyun Lee, Gyeonggi-do (KR);
Jung-Dal Choi, Gyeonggi-do (KR);
Chang-Seok Kang, Gyeonggi-do (KR);
Yoo-Cheol Shin, Gyeonggi-do (KR);
Jong-Sun Sel, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 176 days.

(21) Appl. No.: 11/375,983

(22) Filed: Mar. 15, 2006

(65) Prior Publication Data

US 2006/0208338 A1 Sep. 21, 2006

(30) Foreign Application Priority Data

Mar. 16, 2005 (KR) .................... 10-2005-0021943

(51) Int. Cl.
*H01L 21/336* (2006.01)
(52) U.S. Cl. .................. 438/257; 438/266; 257/314; 257/E21.68; 257/E21.691
(58) Field of Classification Search ......... 438/257–267; 257/314–321, E21.68, E21.683, E21.684, 257/E21.689, E21.691
See application file for complete search history.

(56) References Cited

U.S. PATENT DOCUMENTS 6,559,055 B2 * 5/2003 Tuan et al. .................. 438/692

6,962,840 B2 * 11/2005 Kim ............................ 438/197
7,157,762 B2 * 1/2007 Lee ............................ 257/296

FOREIGN PATENT DOCUMENTS

| JP | 2003-204003 | 7/2003 |
| KR | 1020030086825 | 11/2003 |
| KR | 1020040054575 | 6/2004 |

* cited by examiner

*Primary Examiner*—Brook Kebede
(74) *Attorney, Agent, or Firm*—Myers Bigel Sibley & Sajovec

(57) ABSTRACT

Methods of forming a memory device include forming a device isolation layer in a semiconductor substrate including a cell array region and a resistor region, the device isolation layer extending into the resistor region and defining an active region in the semiconductor substrate. A first conductive layer is formed on the device isolation layer in the resistor region. The semiconductor substrate is exposed in the cell array region. A cell insulation layer is formed on a portion of the semiconductor substrate including the exposed cell array region, the active region and the device isolation layer in the resistor region. A second conductive layer is formed on the cell insulation layer in the portion of the semiconductor substrate including the exposed cell array region, the active region and the device isolation layer in the resistor region. The second conductive layer is etched to form a cell gate electrode in the cell array region and to concurrently remove the second conductive layer from the resistor region and the first conductive layer is etched in the resistor region to form a resistor.

14 Claims, 12 Drawing Sheets

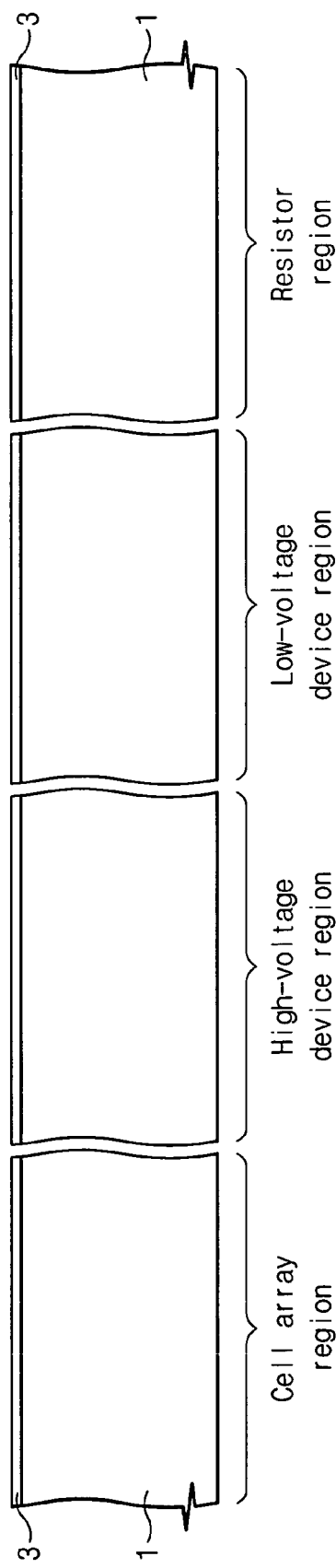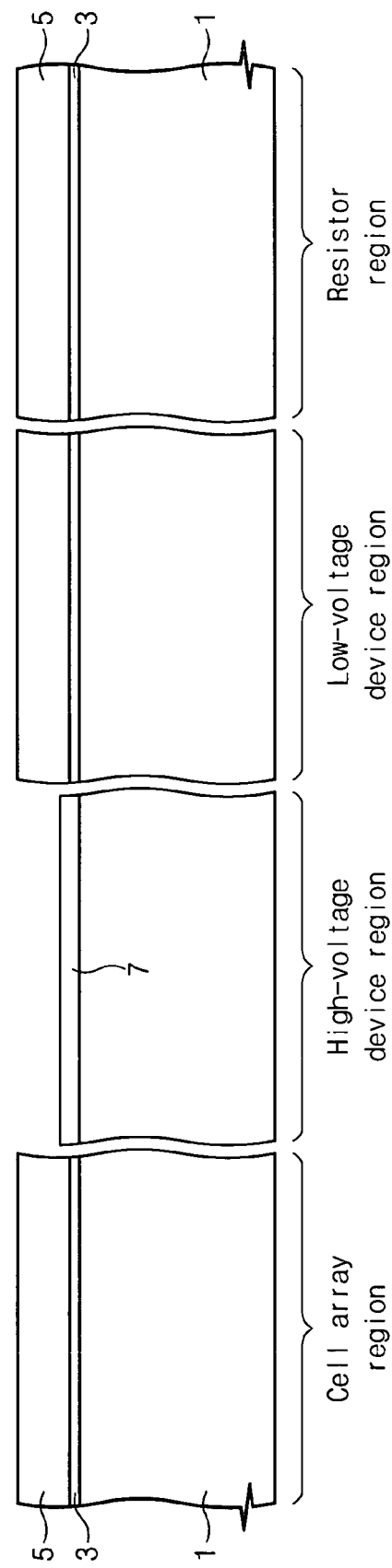

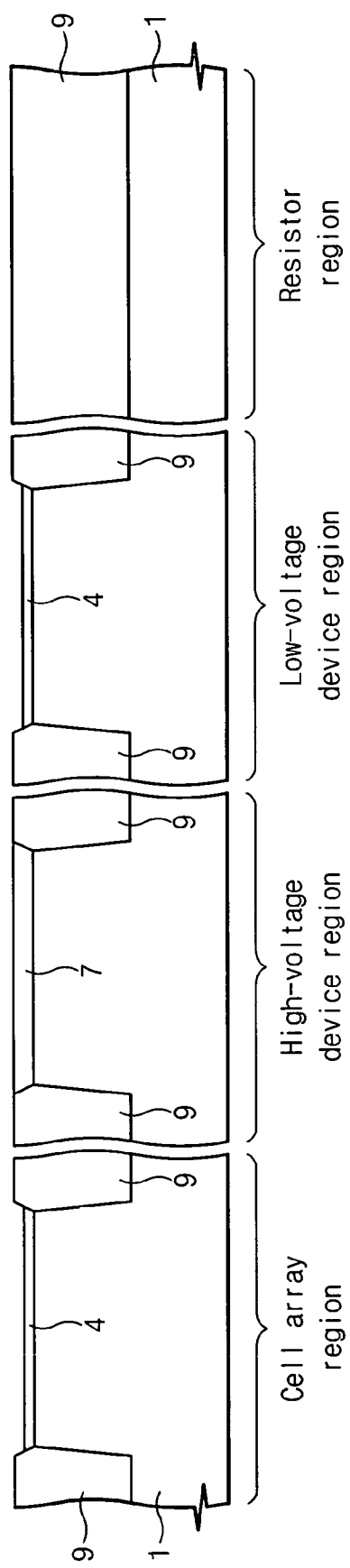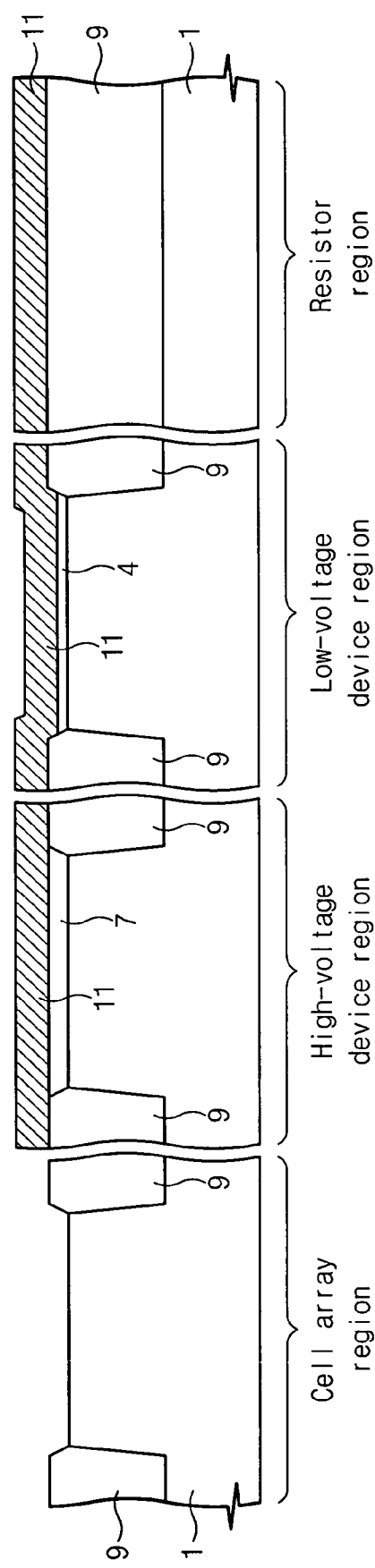

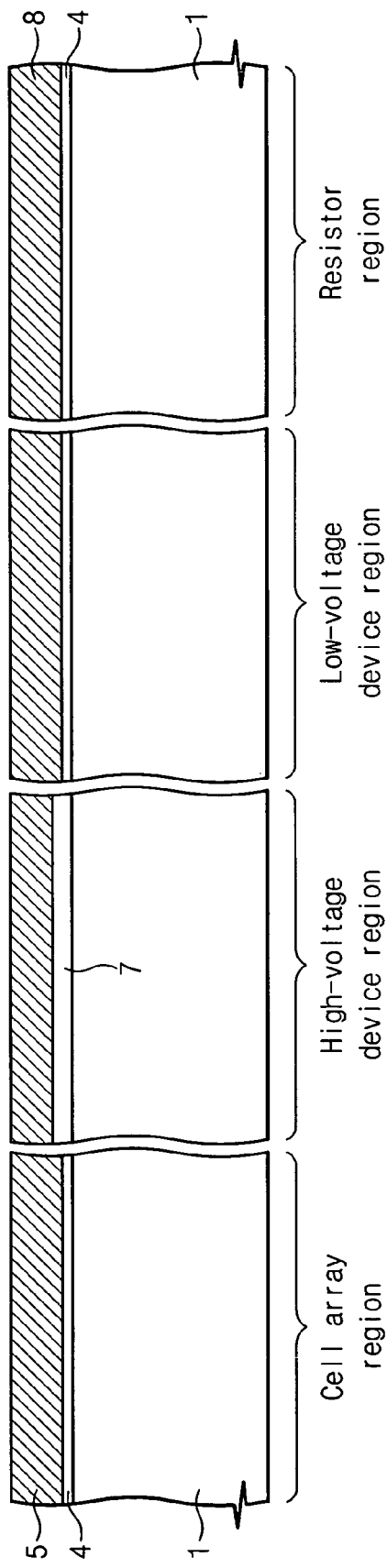
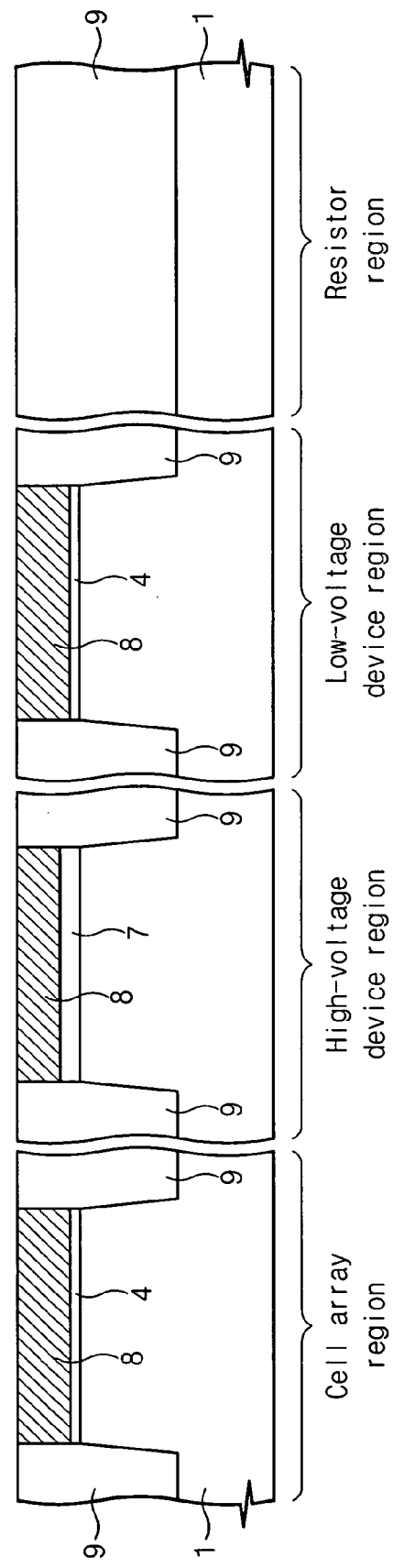

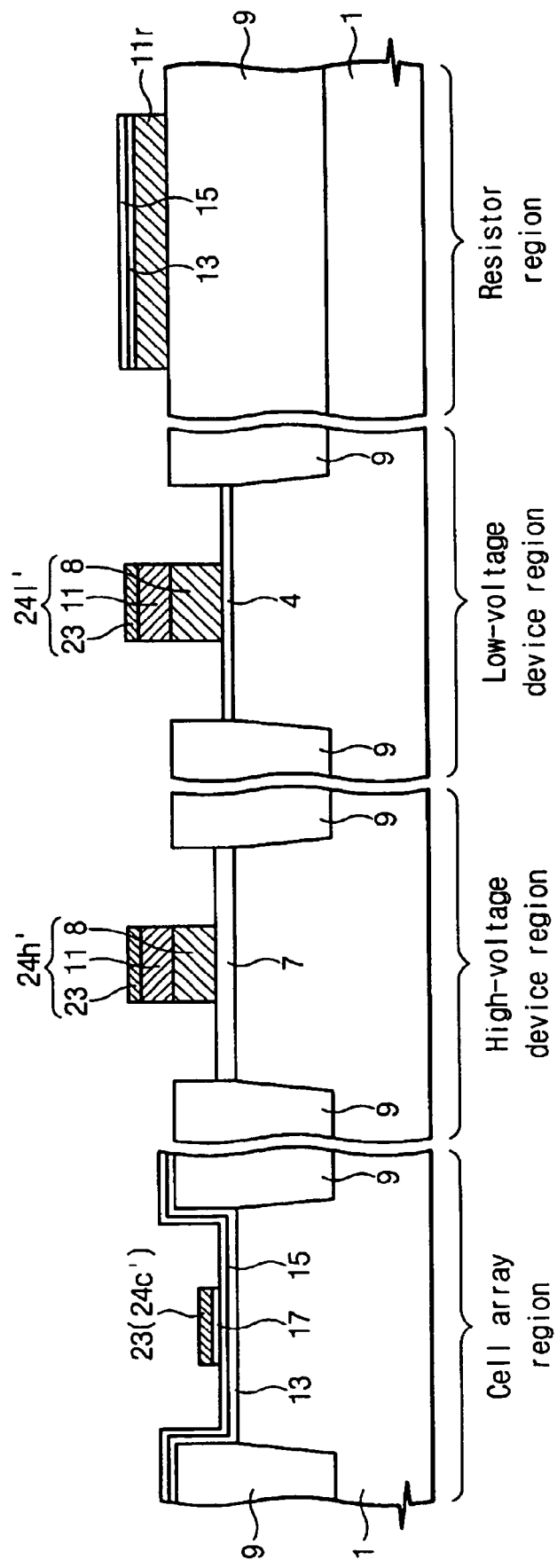

METHODS OF FORMING NONVOLATILE MEMORY DEVICES

CROSS-REFERENCE TO RELATED APPLICATIONS

This application is related to and claims priority under 35 U.S.C. § 119 from Korean Patent Application 2005-21943 filed on Mar. 16, 2005, the entire contents of which are hereby incorporated herein by reference.

BACKGROUND OF THE INVENTION

The present invention relates to semiconductor devices and methods of forming the same, and more particularly, to memory devices and methods of forming the same.

A nonvolatile memory device typically includes a peripheral circuit for performing program, erase and read operations on memory cells. The peripheral circuit generally includes a high-voltage device for applying a high voltage to the cell and a low-voltage device for applying a low voltage to the cell. The peripheral circuit also typically includes a resistor for adjusting signal delay, voltage and/or current levels. Meanwhile, a cell gate electrode and a peripheral circuit gate electrode of the memory device typically need a metal-containing layer for enhancing the operating speed of the device. In order to enhance the read/write speed of the memory cell, an electron flow from the gate electrode may be blocked by forming an electrode on a gate insulation layer of the memory cell using a conductive material with a work function of 4.0 eV or more as described, for example, in Korean Patent Application No. 2003-0075516. In general, a conductive material of a high work function is preferably a metal-containing layer. However, the metal-containing layer generally has a very-low sheet resistance and is, thus, often unsuitable for a resistor as a resistor formed using a metal-containing layer with a very-low sheet resistance generally must have its area increased so as to obtain a desired resistance. This may cause difficulties in providing a high integration of the memory device.

In general, the cell gate electrode, the peripheral circuit electrode and the resistor are formed in the same level. Accordingly, when the gate electrode is formed to include a metal-containing layer, the metal-containing layer is generally also formed in the resistor region. Therefore, an additional photolithography process and an etch mask are typically required to remove the metal-containing layer from the resistor region. In addition, while a cell gate pattern generally needs a charge trapping layer or a floating gate capable of storing an electric charge, the peripheral circuit gate electrode generally needs a gate insulation layer. When a peripheral circuit gate pattern has a floating gate or a charge trapping layer, the memory cell may be unnecessarily programmed by application of a high voltage thereto, causing an increase in a threshold voltage. The peripheral circuit gate pattern typically should not have a floating gate or a charge trapping layer in order to reduce the operating voltage of a peripheral circuit transistor. Thus, when a charge trapping layer is formed in a cell array region, an additional photolithography process and an etch mask are generally used to remove the charge trapping layer from a peripheral circuit region. As such, a very complicated method is generally used to form a nonvolatile memory device having cell gate electrodes, peripheral circuit electrodes and resistors.

SUMMARY OF THE INVENTION

Embodiments of the present invention include methods of forming a memory device including forming a device isolation layer in a semiconductor substrate including a cell array region and a resistor region, the device isolation layer extending into the resistor region and defining an active region in the semiconductor substrate. A first conductive layer is formed on the device isolation layer in the resistor region. The semiconductor substrate is exposed in the cell array region. A cell insulation layer is formed on a portion of the semiconductor substrate including the exposed cell array region, the active region and the device isolation layer in the resistor region. A second conductive layer is formed on the cell insulation layer in the portion of the semiconductor substrate including the exposed cell array region, the active region and the device isolation layer in the resistor region. The second conductive layer is etched to form a cell gate electrode in the cell array region and to concurrently remove the second conductive layer from the resistor region and the first conductive layer is etched in the resistor region to form a resistor.

In further embodiments, the memory device comprise a nonvolatile memory and forming the cell insulation layer includes forming a cell tunnel insulation layer, a charge-trapping layer and a cell blocking insulation layer stacked over the entire upper surface of the portion of the semiconductor substrate including the exposed cell array region, the active region and the device isolation layer in the resistor region. Forming the second conductive layer includes forming the second conductive layer on the cell blocking insulation layer over the entire upper surface of the portion of the semiconductor substrate including the exposed cell array region, the active region and the device isolation layer in the resistor region.

In other embodiments, the first conductive layer is formed of impurity-doped polysilicon. The charge trapping layer may be formed of a silicon nitride ($Si_3N_4$) layer, a nanocrystalline silicon layer, a nanocrystalline silicon germanium layer, a nanocrystalline metal layer, a nanocrystalline germanium layer, a tantalum oxide (TaO or $Ta_2O_5$) layer, an aluminum oxide ($Al_2O_3$) layer, a hafnium oxide ($HfO_2$) layer, a hafnium aluminum oxide (HfAlO) layer and/or a hafnium silicate nitride (HfSiON) layer.

In yet further embodiments, methods of forming a nonvolatile memory include providing a semiconductor substrate including a cell array region, a high-voltage device region, a low-voltage device region, and a resistor region and forming a high-voltage gate insulation layer on the semiconductor substrate in the high-voltage device region. A low-voltage gate insulation layer is formed on the semiconductor substrate in the low-voltage device region. A device isolation layer is formed in the semiconductor substrate to define an active region. A first conductive layer is formed on the high-voltage region, the low-voltage region, and the resistor region without forming the first conductive layer on the cell array region. A cell insulation layer is formed on a portion of the semiconductor substrate including the cell array region and the first conductive layer and the resistor region. The cell insulation layer is removed from the high-voltage device region and the low-voltage device region to expose the first conductive layer. A second conductive layer is formed on the portion of the semiconductor substrate including the cell array region, the first conductive layer and the resistor region. The second conductive layer in the cell array region is patterned to form a cell gate electrode while concurrently removing the second conductive layer from the resistor region. The second conductive layer and the first conductive layer in the high-voltage device region and the low-voltage device region are patterned to form a peripheral circuit gate electrode while patterning the first conductive layer in the resistor region to form a resistor.

In other embodiments, forming a cell insulation layer includes conformally stacking a cell tunnel insulation layer, a charge trapping layer, and a cell blocking insulation layer over the entire upper surface of the portion of the semiconductor substrate including the cell array region and the first conductive layer and the resistor region. Removing the cell insulation layer includes removing the cell blocking insulation layer, the charge trapping layer, and the cell tunnel insulation layer from the high-voltage device region and the low-voltage device region to expose the first conductive layer. Forming a second conductive layer includes forming the second conductive layer over the entire upper surface of the portion of the semiconductor substrate including the cell array region, the first conductive layer and the resistor region. Patterning the second conductive layer includes etching the second conductive layer in the cell array region to form the cell gate electrode and concurrently removing the second conductive layer from the resistor region. Patterning the second conductive layer and the first conductive layer includes etching the second conductive layer and the first conductive layer in the high-voltage device region and the low-voltage device region to form the peripheral circuit gate electrode while etching the first conductive layer in the resistor region to form the resistor.

In further embodiments, the first conductive layer is formed of impurity-doped polysilicon. The charge trapping layer may be formed of a silicon nitride ($Si_3N_4$) layer, a nanocrystalline silicon layer, a nanocrystalline silicon germanium layer, a nanocrystalline metal layer, a nanocrystalline germanium layer, a tantalum oxide (TaO or $Ta_2O_5$) layer, an aluminum oxide ($Al_2O_3$) layer, a hafnium oxide ($HfO_2$) layer, a hafnium aluminum oxide (HfAlO) layer and/or a hafnium silicate nitride (HfSiON) layer. The second conductive layer may be formed of a metal-containing layer or a bi-layer including the metal-containing layer and an impurity-doped polysilicon layer. The metal-containing layer may be formed of a tantalum nitride (TaN) layer, a tantalum (Ta) layer, a tungsten silicide (WSi) layer, a cobalt silicide (CoSi) layer, a titanium silicide (TiSi) layer, a tungsten (W) layer, a tungsten nitride (WN) layer, a titanium (Ti) layer, a titanium nitride (TiN) layer, a titanium aluminum nitride (TiAlN) layer, a molybdenum (Mo) layer and/or a platinum (Pt) layer.

In yet other embodiments, the methods further include forming a third conductive layer over the entire upper surface of the semiconductor substrate before the removing of the cell blocking insulation layer, the charge trapping layer, and the cell tunnel insulation layer from the high-voltage device region and the low-voltage device region and the third conductive layer is removed from the high-voltage device region and the low-voltage device region when the cell blocking insulation layer, the charge trapping layer, and the cell tunnel insulation layer are removed from the high-voltage device region and the low-voltage device region to expose the first conductive layer. The third conductive layer is etched when the second conductive layer is etched to form a cell gate electrode at the cell array region and to expose the first conductive layer at the resistor region. The third conductive layer may be formed of an impurity-doped polysilicon layer, a metal-containing layer, or a bi-layer including the impurity-doped polysilicon layer and the metal-containing layer.

In further embodiments, the methods further include forming a fourth conductive layer over the entire upper surface of the portion of the semiconductor substrate before the forming of the device isolation layer. The fourth conductive layer is also patterned when the peripheral circuit gate electrode is formed, so that the peripheral circuit gate electrode is a stack that includes the fourth conductive layer, the first conductive layer, and the second conductive layer. The fourth conductive layer may be formed of impurity-doped polysilicon.

In yet other embodiments, memory devices are provided having a semiconductor substrate including a cell array region, a peripheral circuit region, a resistor region and a device isolation layer defining an active region. A cell insulation layer and a cell gate electrode are stacked on the semiconductor substrate in the cell array region. A peripheral circuit gate insulation layer and a peripheral gate electrode are stacked on the semiconductor substrate in the peripheral circuit region. The peripheral gate electrode includes a first conductive layer and a second conductive layer on the first conductive layer. A resistor is disposed on the device isolation layer in the resistor region. The resistor includes the first conductive layer and not the second conductive layer and the cell gate electrode includes the second conductive layer and not the first conductive layer.

In further embodiments, the memory device is a non-volatile memory and the cell insulation layer includes a cell tunnel insulation layer, a charge trapping layer on the cell tunnel insulation layer and a cell blocking insulation layer on the cell tunnel insulating layer and the cell gate electrode is on the cell blocking insulation layer. The cell gate electrode may further include a third conductive layer interposed between the second conductive layer and the cell blocking insulation layer. The peripheral gate electrode may further include a fourth conductive layer interposed between the first conductive layer and the peripheral gate insulation layer.

In other embodiments, the charge trapping layer is a silicon nitride ($Si_3N_4$) layer, a nanocrystalline silicon layer, a nanocrystalline silicon germanium layer, a nanocrystalline metal layer, a nanocrystalline germanium layer, a tantalum oxide (TaO or $Ta_2O_5$) layer, an aluminum oxide ($Al_2O_3$) layer, a hafnium oxide ($HfO_2$) layer, a hafnium aluminum oxide (HfAlO) layer and/or a hafnium silicate nitride (HfSiON) layer. The first conductive layer may be impurity-doped polysilicon. The fourth conductive layer may also be impurity-doped polysilicon. The second conductive layer may be a metal-containing layer or a bi-layer including the metal-containing layer and an impurity-doped polysilicon layer. The third conductive layer may be an impurity-doped polysilicon layer, a metal-containing layer or a bi-layer including the impurity-doped polysilicon layer and the metal-containing layer. The metal-containing layer may be a tantalum nitride (TaN) layer, a tantalum (Ta) layer, a tungsten silicide (WSi) layer, a cobalt silicide (CoSi) layer, a titanium silicide (TiSi) layer, a tungsten (W) layer, a tungsten nitride (WN) layer, a titanium (Ti) layer, a titanium nitride (TiN) layer, a titanium aluminum nitride (TiAlN) layer, a molybdenum (Mo) layer and/or a platinum (Pt) layer.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the of the invention. In the drawings:

FIGS. 1 through 9 are cross-sectional views illustrating methods of forming a nonvolatile memory according to some embodiments of the present invention;

FIGS. 10 through 12 are cross-sectional views illustrating methods of forming a nonvolatile memory according to further embodiments of the present invention;

FIG. 15 is a cross-sectional view of a nonvolatile memory according to some embodiments of the present invention.

DETAILED DESCRIPTION OF THE INVENTION

Figure 5:
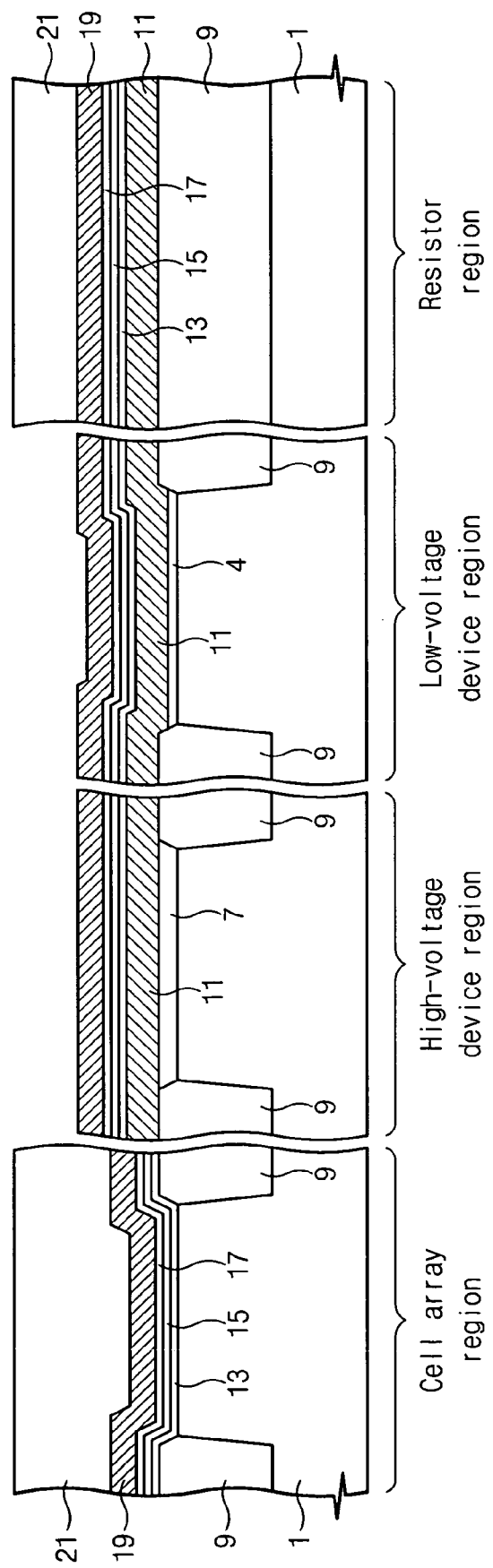

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Some embodiments of the present invention can be applied to a floating trap-type nonvolatile memory, such as a silicon-oxide-nitride-oxide-semiconductor (SONOS) memory, and methods of forming the same. Some embodiments of the present invention can be applied to various nonvolatile memories, such as a floating gate-type nonvolatile memory, and methods of forming the same.

FIGS. 1 through 9 are cross-sectional views illustrating a method of forming a nonvolatile memory according to some embodiments of the present invention. Referring to FIG. 1, a pad oxide layer 3 is formed on a semiconductor substrate 1 that includes a cell array region, a high-voltage device region, a low-voltage device region and a resistor region. The pad oxide layer 3 may be formed, for example, of a thermal oxide layer by thermal oxidation.

Referring to FIG. 2, a first mask 5, that exposes the high-voltage device region while covering the other regions, is formed on the pad oxide layer 3. The first mask 5 may be formed of, for example, of a silicon nitride layer. A thermal oxidation process may be performed on the semiconductor substrate 1 to thicken the pad oxide layer 3 exposed by the first mask 5 to thereby form a high-voltage gate insulation layer 7.

Referring to FIG. 3, the first mask 5 is removed after the formation of the high-voltage gate insulation layer 7. When the first mask 5 is formed of a silicon nitride layer, it may be removed using, for example, an etching solution containing a phosphoric acid. A device isolation layer 9 is formed on the semiconductor substrate 1, for example, by shallow trench isolation (STI). At this time, the device isolation layer 9 is disposed in the resistor region and isolating the other regions. Thereafter, a wet etching process using an etching solution containing a fluoric acid may be performed to remove the pad oxide layer 3, to thereby expose the semiconductor substrate 1 at the cell array region and the low-voltage device region. At this time, an upper portion of the high-voltage gate insulation layer 7 may be partially removed. A thermal oxidation process may then be performed again to form a low-voltage gate insulation layer 4 on the semiconductor substrate 1 of both the low-voltage device region and the cell array region. The thermal oxidation process also may again thicken the high-voltage gate insulation layer 7.

Referring to FIG. 4, a first conductive layer 11 is formed over the entire upper surface of the semiconductor substrate 1. The first conductive layer 11 in some embodiments is formed of impurity-doped polysilicon. Using a mask (not illustrated) covering all the regions except the cell array region, the first conductive layer 11 may be patterned and removed from the cell array region to thereby expose the low-voltage gate insulation layer 4 in the cell array region. The exposed low-voltage gate insulation layer 4 is removed to expose the semiconductor substrate 1 in the cell array region as illustrated in FIG. 4.

Referring now to FIG. 5, a cell tunnel insulation layer 13, a charge trapping layer 15, and a cell blocking insulation layer 17 are sequentially stacked over the entire upper surface of the semiconductor substrate 1. A second conductive layer 19 is formed on the cell blocking insulation layer 17. The charge trapping layer 15 may be formed, for example, of a material selected from the group consisting of a silicon nitride ($Si_3N_4$) layer, a nanocrystalline silicon layer, a nanocrystalline silicon germanium layer, a nanocrystalline metal layer, a nanocrystalline germanium layer, a tantalum oxide (TaO or $Ta_2O_5$) layer, an aluminum oxide ($Al_2O_3$) layer, a hafnium oxide ($HfO_2$) layer, a hafnium aluminum oxide (HfAlO) layer, a hafnium silicate nitride (HfSiON) layer, and a combination thereof.

The nanocrystalline silicon layer, the nanocrystalline silicon germanium layer, the nanocrystalline metal layer, and the nanocrystalline germanium layer typically have several-nanometer crystals and may be formed, for example, by (low-pressure) chemical vapor deposition (CVD). The cell tunnel insulation layer 13 may be formed of a material selected from the group consisting of a silicon oxide layer, a tantalum oxide (TaO or $Ta_2O_5$) layer, an aluminum oxide ($Al_2O_3$) layer, a hafnium oxide ($HfO_2$) layer, a hafnium aluminum oxide (HfAlO) layer, a hafnium silicate nitride (HfSiON) layer, and a combination thereof. The second conductive layer 19 may be formed of a metal-containing layer or a bi-layer including the metal-containing layer and an impurity-doped polysilicon layer. The metal-containing layer may be formed of a material selected from the group consisting of a tantalum nitride (TaN) layer, a tantalum (Ta) layer, a tungsten silicide (WSi) layer, a cobalt silicide (CoSi) layer, a titanium silicide (TiSi) layer, a tungsten (W) layer, a tungsten nitride (WN) layer, a titanium (Ti) layer, a titanium nitride (TiN) layer, a titanium aluminum nitride (TiAlN) layer, a molybdenum (Mo) layer, a platinum (Pt) layer, and a combination thereof. A second mask 21 that covers the cell array region and the resistor region and exposes the high-voltage device region and the low-voltage device region is shown formed on the second conductive layer 19.

Figure 6:
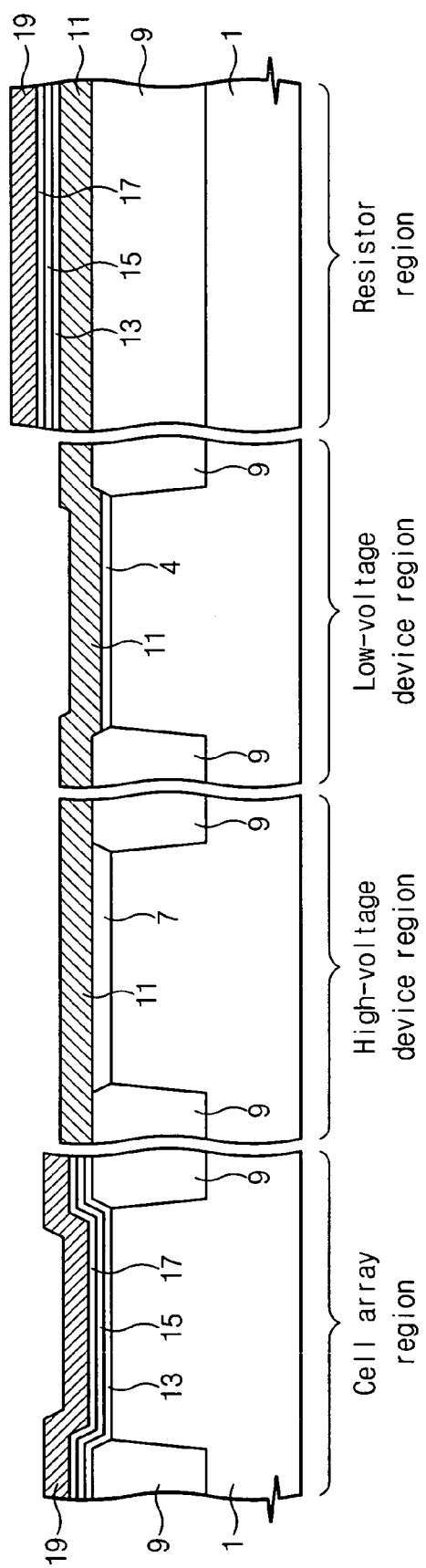

Referring to FIG. 6, using the second mask 21 as an etch mask, the second conductive layer 19, the cell blocking insulation layer 17, the charge trapping layer 15, and the cell tunnel insulation layer 13 in both the high-voltage device region and the low-voltage device region are removed to expose the first conductive layer 11.

Figure 7:
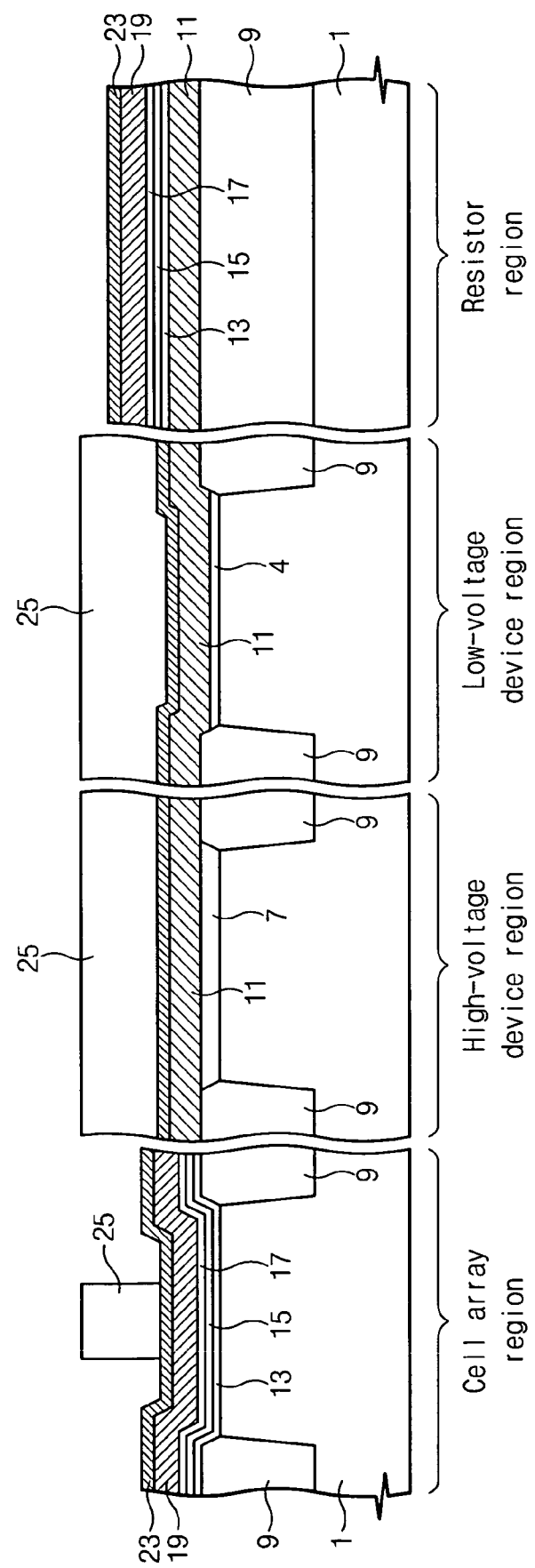

Referring to FIG. 7, a third conductive layer 23 is shown formed over the entire upper surface of the semiconductor substrate 1. The third conductive layer 23 may be formed of an impurity-doped polysilicon layer, a metal-containing layer, and/or a bi-layer including the impurity-doped polysilicon layer and the metal-containing layer. The metal-containing layer may be formed of a material selected from the group consisting of a tantalum nitride (TaN) layer, a tantalum (Ta) layer, a tungsten silicide (WSi) layer, a cobalt silicide (CoSi) layer, a titanium silicide (TiSi) layer, a tungsten (W) layer, a tungsten nitride (WN) layer, a titanium (Ti) layer, a titanium nitride (TiN) layer, a titanium aluminum nitride (TiAlN) layer, a molybdenum (Mo) layer, a platinum (Pt) layer, and a combination thereof. A third mask 25 that covers the high-voltage region and the low-voltage device region, exposes the resistor region and defines a cell gate electrode in the cell array region is shown formed on the third conductive layer 23.

Figure 8:
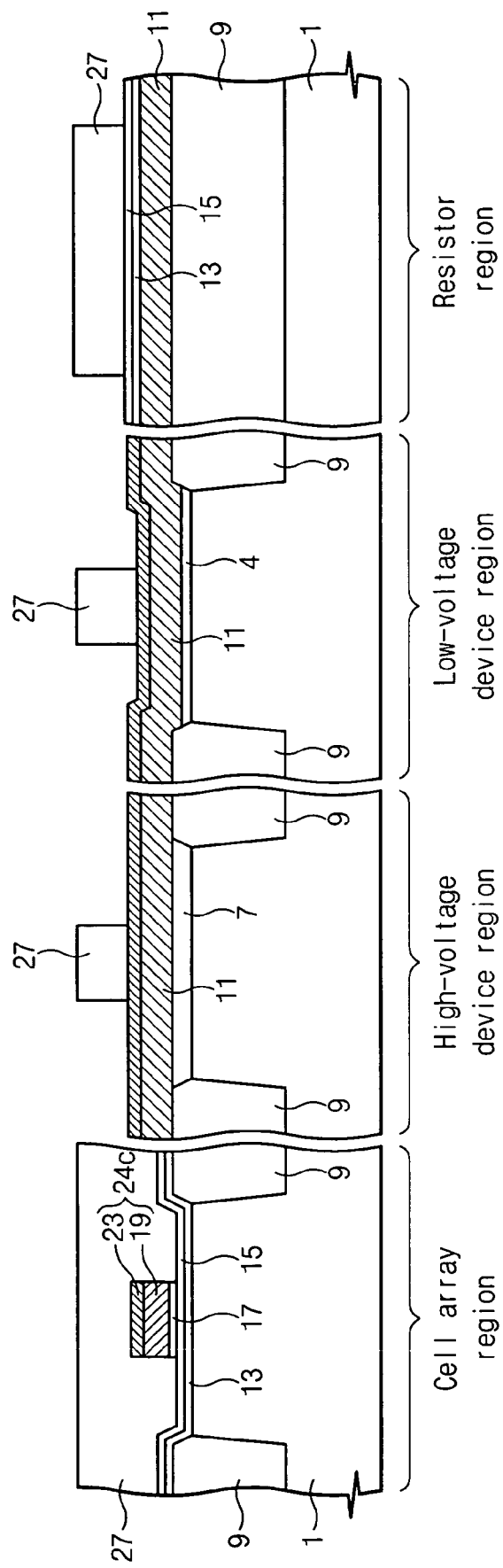

Referring now to FIG. 8, using the third mask 25 as an etch mask, the third conductive layer 23 and the second conductive layer 19 in the cell array region are removed to form a cell gate electrode 24c. Concurrently, the third conductive layer 23 and the second conductive layer 19 in the resistor region are removed. In the etching process, the cell blocking insulation layer 17 may also be removed to expose the charge trapping layer 15. Although not illustrated in FIG. 8, the charge trapping layer 15 and the cell tunnel insulation layer 13 may also be removed to expose the first conductive layer 11. Thereafter, the third mask 25 is removed. A fourth mask 27 is then formed on the resulting surface, such that it covers the cell array region and defines peripheral circuit electrodes in the high-voltage and low-voltage device regions and a resistor in the resistor region.

Figure 9:
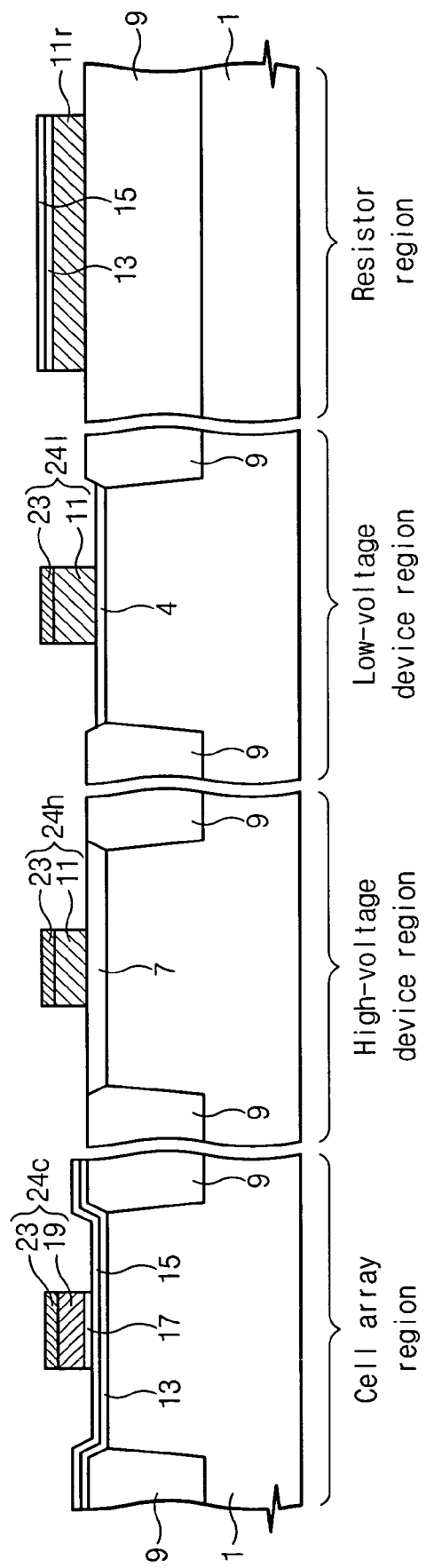

Referring to FIG. 9, using the fourth mask layer 27 as an etch mask, the third conductive layer 23 and the first conductive layer 11 in both the high-voltage region and the low-voltage region are etched to form a high-voltage gate electrode 24h and a low-voltage gate electrode 24l, and concurrently, the charge trapping layer 15, the cell tunnel insulation layer 13 and the first conductive layer 11 in the resistor region are etched to form a resistor 11r to thereby complete the formation of a nonvolatile memory illustrated in FIG. 9.

As seen in the structure of the nonvolatile memory device embodiments of FIG. 9, the cell gate electrode 24c includes the second conductive layer 19 and the third conductive layer 23, and the high-voltage gate electrode 24h and the low-voltage gate electrode 24l each include the first conductive layer 11 and the third conductive layer 23. When the third conductive layer 23 is formed of the metal containing layer, the device can be enhanced in operating speed. The resistor 11r includes the first conductive layer 11 formed of impurity-doped polysilicon, and, thus, its resistance may be more easily adjusted by adjustment of the doping concentration of the layer 11.

As the third mask 25 defining the cell gate electrode 24c exposes the resistor region, the second and third conductive layers 19 and 23 that are disposed on the resistor 11r and may contain metal may be removed during the formation of the cell gate electrode 24c. Accordingly, no additional mask for removing the second and third conductive layers 19 and 23 on the resistor 11r needs to be formed, which may simplify the fabrication process.

Figure 12:
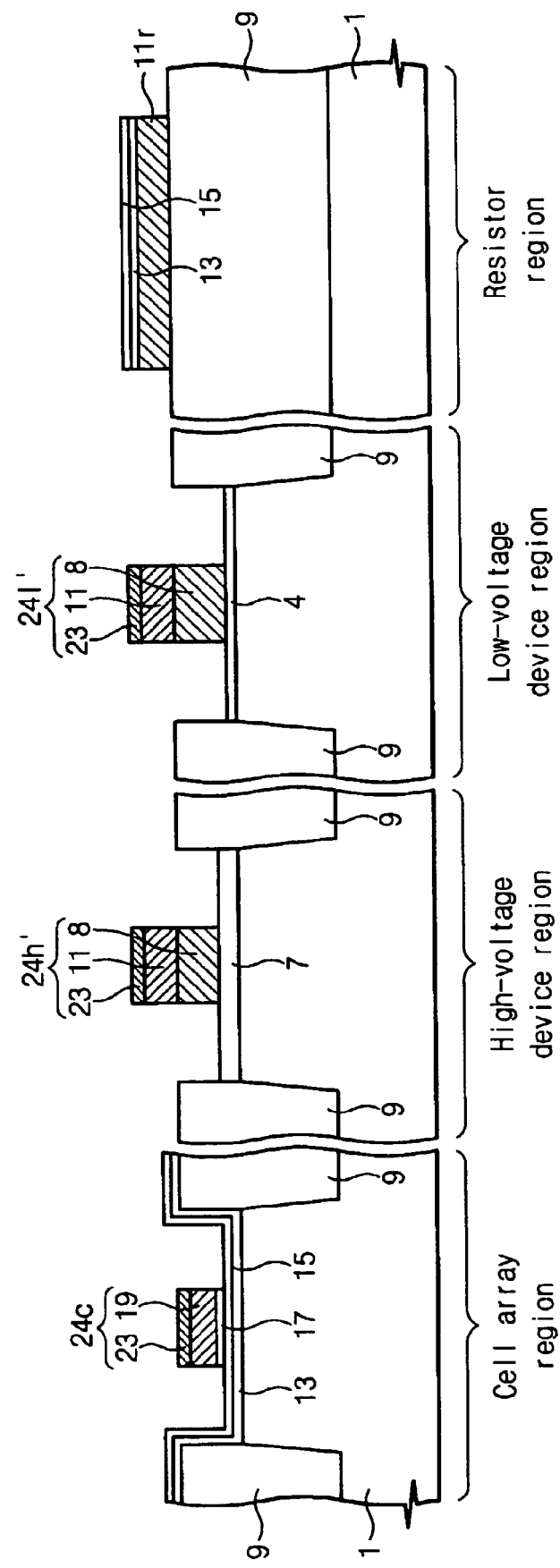

FIGS. 10 through 12 are cross-sectional views illustrating a method of forming a nonvolatile memory according to further embodiments of the present invention. The embodiments of FIGS. 10 through 12 are similar in various aspects to the embodiments described with reference to FIGS. 1 through 9, with the exception that the fourth conductive layer is further formed before the formation of the device isolation layer. Accordingly, corresponding operations as described with reference to FIGS. 1-9 may be used in some embodiments to form a self-aligned polysilicon structure.

Referring to FIG. 10, in a similar manner as described with reference to FIG. 2, a high-voltage gate insulation layer 7 is formed on the semiconductor substrate 1 in the high-voltage device region. Thereafter, the mask 5 and the pad oxidation layer 3 (FIG. 2) on the semiconductor substrate 1 are removed. Next, a thermal oxidation process is again performed to form a low-voltage device gate insulation layer 4 in the cell array region, the low-voltage device region and the resistor region. A fourth conductive layer 8 (the reference to fourth herein to distinguish from the conductive layers discussed previously as contrasted with indicating a fourth conductive layer formed on the semiconductor substrate 1 in the embodiments of FIGS. 10 through 12) is formed over the entire upper surface of the semiconductor substrate 1. The fourth conductive layer 8 in some embodiments is formed of impurity-doped polysilicon.

Referring to FIG. 11, the fourth conductive layer 8, the gate insulation layers 4 and 7, and the semiconductor substrate 1 are patterned to form a trench. The trench may be filled with an insulation layer, and the resulting structure may be planarized to form the device isolation layer 9. Specifically, a wide device isolation layer 9 formed in the resistor region and isolation between the respective regions as shown in FIG. 11. The upper portions of the device isolation layer 9 and the fourth conductive layer 8 may be planarized and aligned.

Operations between the structures shown in FIGS. 11 and 12 may proceed generally as discussed previously with respect to FIGS. 4, 5 and 7-8. Mare particularly, as illustrated in FIG. 4, the first conductive layer 11 may be stacked and patterned to expose the semiconductor substrate 1 of the cell array region. Next, as illustrated in FIG. 5, the cell tunnel insulation layer 13, the charge trapping layer 15, the cell blocking insulation layer 17, and the second conductive layer 19 may be stacked. Thereafter, a patterning process using the second mask 21 as an etch mask may be performed to remove the second conductive layer 19, the cell blocking insulation layer 17, the charge trapping layer 15, and the cell tunnel insulation layer 13 from the high-voltage device region and the low-voltage device region to thereby expose the first conductive layer 11.

Next, as illustrate in FIG. 7, the third conductive layer 23 may be stacked. Thereafter, a patterning process using the second mask 25 as an etch mask may be performed to form the cell gate electrode 24c and also to remove the third and second conductive layers 23 and 19 on the cell blocking insulation layer 17 from the resistor region. Next, using the fourth mask 27 (FIG. 8) as an etch mask, the third conductive layer 23, the first conductive layer 11, and the fourth conductive layer 8 may be patterned to form the high-voltage gate electrode 24h' and the low-voltage gate electrode 24l' in the high-voltage device region and the low-voltage device region and to form the resistor 11r in the resistor region to thereby complete the formation of a nonvolatile memory structure as illustrated in FIG. 12.

As such, in the nonvolatile memory of the embodiments of FIG. 12, the cell gate electrode 24c includes the -stacked second and third conductive layers 19 and 23, and the high-voltage gate electrode 24h' and the low-voltage gate electrode 24l' each include the -stacked fourth, first and third conductive layers 8, 11 and 23.

Figure 13:
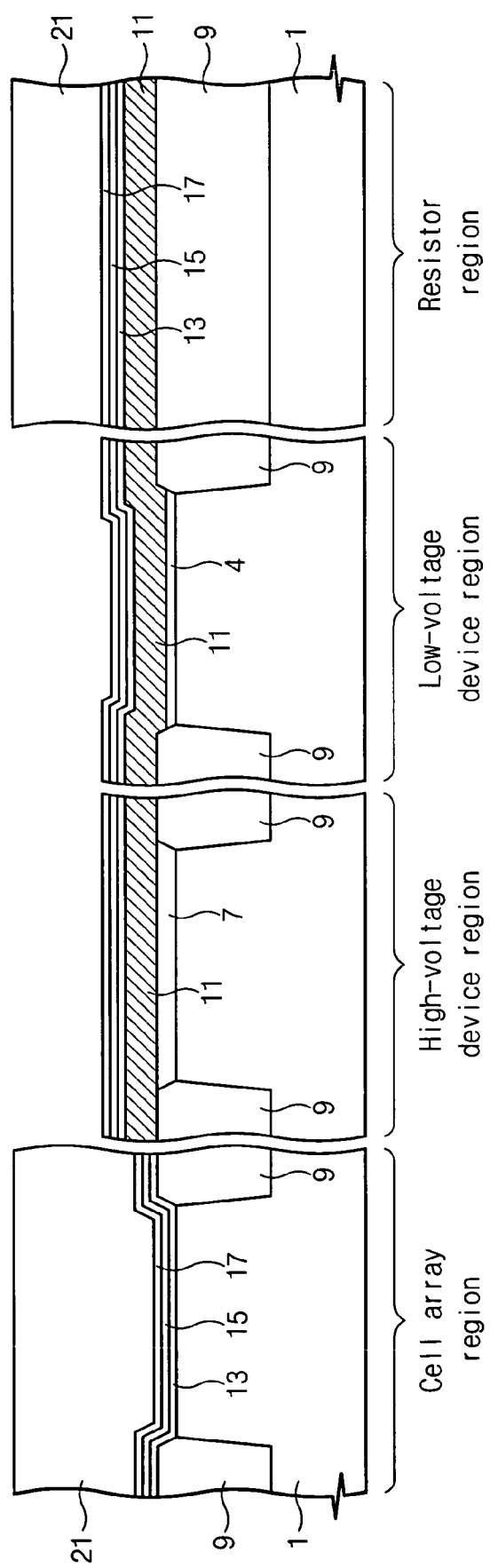
FIGS. 13 and 14 are cross-sectional views illustrating methods of forming a nonvolatile memory according to other embodiments of the present invention.
Figure 14:
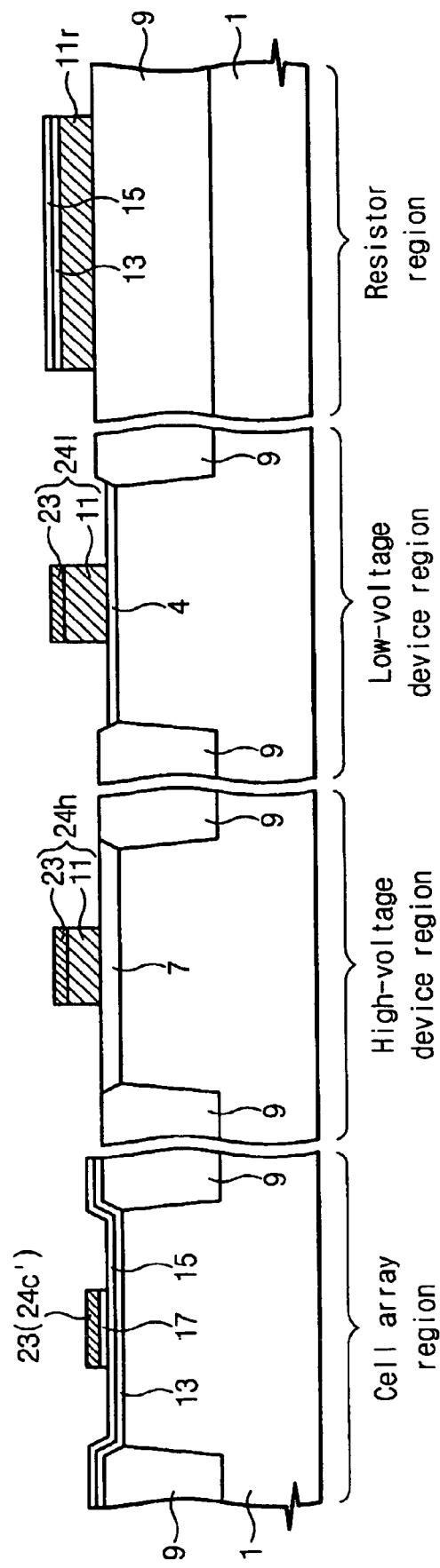

FIGS. 13 and 14 are cross-sectional views illustrating a method of forming a nonvolatile memory according to other embodiments of the present invention. As compared to the previously described embodiment illustrated in FIGS. 1 through 9, the embodiments of FIGS. 13 and 14 do not include formation of the second conductive layer 19. Although the second conductive layer 19 may serve to protect the cell tunnel insulation layer 13, the charge trapping layer 15 and the cell blocking insulation layer 17, some embodiments of the present invention do not include formation of the second conductive layer 19.

Referring to FIG. 13 and FIG. 4, starting at the stage illustrated in FIG. 4, the cell tunnel insulation layer 13, the charge trapping layer 15, and the cell blocking insulation layer 17 are conformally stacked on the semiconductor substrate 1. As shown in FIG. 13, without first depositing the second conductive layer 19, the second mask 21 that covers the cell array region and the resistor region and exposes the high-voltage device region and the low-voltage device region is formed on the cell blocking insulation layer 17. Although not illustrated in FIG. 13, a patterning process using the second mask 21 as an etch mask may be performed to sequentially remove the cell blocking insulation layer 17, the charge trapping layer 15, and the cell tunnel insulation layer 13 from the high-voltage device region and the low-voltage device region to thereby expose the first conductive layer 11 in those regions.

Next, substantially as illustrated in FIG. 7, the third conductive layer 23 is deposited after removing the second mask 21. Thereafter, a patterning process using the second mask 25 as an etch mask is performed to form the cell gate electrode 24c' and also to remove the third conductive layer 23 and the cell blocking insulation layer 17 from the resistor region. Next, using the fourth mask 27 (FIG. 8) as an etch mask, the third conductive layer 23 and the first conductive layer 11 are patterned to form the high-voltage gate electrode 24h and the low-voltage gate electrode 24l in the high-voltage device region and the low-voltage device region and to form the resistor 11r in the resistor region to thereby complete the formation of the nonvolatile memory structure illustrated in FIG. 14.

In the nonvolatile memory structure of FIG. 14, the cell gate electrode 24c' includes the third conductive layer 23 and does not include the second conductive layer 19. The high-voltage gate electrode 24h and the low-voltage gate electrode 24l each include the stacked first and third conductive layers 11 and 23.

FIG. 15 is a cross-sectional view of a nonvolatile memory according some embodiments of the present invention. The nonvolatile memory of FIG. 15 may be formed using the methods described with reference to FIGS. 10 through 14. For example, as illustrated in FIG. 14, the fourth conductive layer 8 may be formed before the formation of the device isolation layer 9 over the entire upper surface of the semiconductor substrate 1. The fourth conductive layer 8, the gate insulation layers 4 and 7, and the semiconductor substrate 1 may be patterned to form a trench. The trench may be filled with an insulation layer, and the resulting structure may be planarized to form the device isolation layer 9 illustrated in FIG. 15, including a wide device isolation layer 9 formed in the resistor region on which a resistor may be subsequently formed. The upper portions of the device isolation layer 9 and the fourth conductive layer 8 may be planarized and aligned as illustrated in FIG. 15.

Thereafter, substantially as illustrated and described with reference to FIG. 4 previously, the first conductive layer 11 may be formed and patterned to expose the semiconductor substrate 1 in the cell array region. Next, substantially as illustrated and described with reference to FIG. 5 previously, the cell tunnel insulation layer 13, the charge trapping layer 15, the cell blocking insulation layer 17, and the second conductive layer 19 may be formed in a stacked structure. Thereafter, a patterning process using the second mask 21 as an etch mask may be performed to remove the cell blocking insulation layer 17, the charge trapping layer 15, and the cell tunnel insulation layer 13 from the high-voltage device region and the low-voltage device region to thereby expose the first conductive layer 11 in those regions.

Next, substantially as illustrated and described with reference to FIG. 7 previously, the third conductive layer 23 may be formed. Thereafter, a patterning process using the second mask 25 as an etch mask may be performed to form the cell gate electrode 24c' and also to remove the third conductive layer 23 and the cell blocking insulation layer 17 from the resistor region. Next, using the fourth mask 27 (FIG. 8) as an etch mask, the third conductive layer 23, the first conductive layer 11, and the fourth conductive layer 8 may be patterned to form the high-voltage gate electrode 24h' and the low-voltage gate electrode 24l' in the high-voltage device region and the low-voltage device region and to form the resistor 11r in the resistor region to thereby complete the formation of the nonvolatile memory device structure illustrated in FIG. 15.

In the nonvolatile memory structure of FIG. 15, the cell gate electrode 24c' includes third conductive layer 23 and does not include the second conductive layer 19. The high-voltage gate electrode 24h' and the low-voltage gate electrode 24l' each include the stacked fourth, first and third conductive layers 8, 11 and 23.

As described above, in some embodiments, each of the resistors 11r includes an impurity-doped polysilicon structure. As such, its resistance may be more easily adjusted by adjustment of the doping concentration.

In some of the method embodiments described above, because the mask defining the cell gate electrode exposes the resistor region, the second and third conductive layers (which are disposed on the resistor and may include metal) may be removed during the formation of the cell gate electrode. Accordingly, no additional mask for removing the second and third conductive layers 19 and 23 may need to be formed, which may simplify the device fabrication process.

In some of the method embodiments described above, the cell gate electrode includes the second and third conductive layers, and the high-voltage and high voltage gate electrodes each include the first and third conductive layers. Accordingly, when the third conductive layer is formed of the metal-containing layer, the resulting device may be enhanced in operating speed. In addition, since the resistor may be formed of the first conductive layer containing impurity-doped polysilicon, its resistance may be more easily adjusted by the adjustment of the doping concentration.

In yet other embodiments methods of forming a nonvolatile memory are provided, including: forming a device isolation layer in a semiconductor substrate including a cell array region and a resistor region to thereby define an active region; forming a first conductive layer that covers the device isolation layer in the resistor region and exposes the semiconductor substrate in the cell array region; sequentially forming a cell tunnel insulation layer, a charge trapping layer, a cell blocking insulation layer, and a second conductive layer over the entire upper surface of the semiconductor substrate; etching the second conductive layer in the cell array region to form a cell gate electrode and simultaneously removing the second conductive layer from the resistor region; and etching the first conductive layer in the resistor region to thereby form a resistor. The second conductive layer may be formed to include a metal-containing layer that is formed using a conductive material with a work function of 4.0 eV or more and in the cell gate electrode including the second conductive layer, an electron flow from a gate can be blocked to reduce a resistance, which may enhance the read/write speed of the device.

In some embodiments, the charge trapping layer serves to trap an electric charge. The electric charge may be trapped at the charge trapping layer, an interface between the charge trapping layer and the cell tunnel insulation layer, or an interface between the charge trapping layer and the cell blocking insulation layer. The electrical charge may be tunneled through the cell tunnel insulation layer. The cell blocking insulation layer may serve to prevent the electrical charge from moving freely to the cell gate electrode.

In some embodiments of the present invention, a method of forming a nonvolatile memory includes: preparing a semiconductor substrate including a cell array region, a high-voltage device region, a low-voltage device region, and a resistor region; forming a high-voltage gate insulation layer on the semiconductor substrate in the high-voltage device region; forming a low-voltage gate insulation layer on the semiconductor substrate in the low-voltage device region; forming a device isolation layer in a semiconductor substrate to define an active region; forming a first conductive layer that exposes the semiconductor substrate in the cell array region and covers the high-voltage region, the low-voltage region, and the resistor region; conformally stacking a cell tunnel insulation layer, a charge trapping layer, and a cell blocking insulation layer over the entire upper surface of the semiconductor substrate; removing the cell blocking insulation layer, the charge trapping layer, and the cell tunnel insulation layer from the high-voltage device region and the low-voltage device region to thereby expose the first conductive layer; forming a second conductive layer over the entire upper surface of the semiconductor substrate; etching the second conductive layer in the cell array region to form a cell gate electrode and simultaneously removing the second conductive layer from the resistor region; and etching the second conductive layer and the first conductive layer in the high-voltage device region and the low-voltage device region to form a peripheral circuit gate electrode, and etching the first conductive layer in the resistor region to form a resistor.

In still further embodiments, the method may further include forming a third conductive layer over the entire upper surface of the semiconductor substrate before the removing of the cell blocking insulation layer, the charge trapping layer, and the cell tunnel insulation layer from the high-voltage device region and the low-voltage device region. In this case, the third conductive layer, the cell blocking insulation layer, the charge trapping layer, and the cell tunnel insulation layer are removed from the high-voltage device region and the low-voltage device region to expose the first conductive layer. Also, the second conductive layer and the third conductive layer in the cell array region are etched to form a cell gate electrode and simultaneously the second conductive layer and the third conductive layer are removed from the resistor region.

In still further embodiments, the second conductive layer may be formed of a metal-containing layer or a bi-layer including the metal-containing layer and an impurity-doped polysilicon layer. The third conductive layer may be formed of an impurity-doped polysilicon layer, a metal-containing layer, or a bi-layer including the impurity-doped polysilicon layer and the metal-containing layer. The metal-containing layer may be formed of one selected from the group consisting of a tantalum nitride (TaN) layer, a tantalum (Ta) layer, a tungsten silicide (WSi) layer, a cobalt silicide (CoSi) layer, a titanium silicide (TiSi) layer, a tungsten (W) layer, a tungsten nitride (WN) layer, a titanium (Ti) layer, a titanium nitride (TiN) layer, a titanium aluminum nitride (TiAlN) layer, a molybdenum (Mo) layer, a platinum (Pt) layer, and a combination thereof.

In still further embodiments, the above method may further include forming a fourth conductive layer over the entire upper surface of the semiconductor substrate before the forming of the device isolation layer. In this case, the fourth conductive layer is also patterned at the formation of the peripheral circuit gate electrode such that the peripheral circuit gate electrode is formed to include the fourth conductive layer, the first conductive layer, and the second conductive layer that are sequentially stacked. The fourth conductive layer is formed of impurity-doped polysilicon.

In other embodiments of the present invention, a nonvolatile memory including: a device isolation layer formed in a semiconductor substrate including a cell array region, a peripheral circuit region, and a resistor region to define an active region; a cell tunnel insulation layer, a charge trapping layer, a cell blocking insulation layer, and a cell gate electrode sequentially stacked on the semiconductor substrate in the cell array region; a peripheral circuit gate insulation layer and a peripheral gate electrode sequentially stacked on the semiconductor substrate in the peripheral circuit region; and a resistor disposed on the device isolation layer in the resistor region, wherein the resistor includes a first conductive layer, the peripheral gate electrode includes the first conductive layer and a second conductive layer that are sequentially stacked, and the cell gate electrode includes the second conductive layer.

In some embodiments, the peripheral circuit region may include the high-voltage device region and the low-voltage device region. The peripheral gate insulation layer may serve as the high-voltage gate insulation layer in the high-voltage device isolation region. Also, the peripheral gate insulation layer may serve as the low-voltage gate insulation layer in the low-voltage device isolation region. The high-voltage gate insulation layer is thicker than the low-voltage gate insulation layer.

In other embodiments, the cell gate electrode may further include a third conductive layer interposed between the second conductive layer and the cell blocking insulation layer. The peripheral gate electrode may further include a fourth conductive layer interposed between the first conductive layer and the peripheral gate insulation layer.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A method of forming a memory device, the method comprising:
    forming a device isolation layer in a semiconductor substrate including a cell array region and a resistor region, the device isolation layer extending into the resistor region and defining an active region in the semiconductor substrate;
    forming a first conductive layer on the device isolation layer in the resistor region;
    exposing the semiconductor substrate in the cell array region;
    forming a cell insulation layer on a portion of the semiconductor substrate including the exposed cell array region, the active region and the device isolation layer in the resistor region;
    forming a second conductive layer on the cell insulation layer in the portion of the semiconductor substrate including the cell array region, the active region and the device isolation layer in the resistor region;
    etching the second conductive layer to form a cell gate electrode in the cell array region and to concurrently remove the second conductive layer from the resistor region; and
    etching the first conductive layer in the resistor region to form a resistor.

2. The method of claim 1, wherein the memory device comprise a nonvolatile memory and wherein forming the cell insulation layer comprises forming a cell tunnel insulation layer, a charge-trapping layer and a cell blocking insulation layer stacked over the entire upper surface of the portion of the semiconductor substrate including the cell array region, the active region and the device isolation layer in the resistor region and wherein forming the second conductive layer comprises forming a second conductive layer on the cell blocking insulation layer over the entire upper surface of the portion of the semiconductor substrate including the cell array region, the active region and the device isolation layer in the resistor region.

3. The method of claim 2, wherein the first conductive layer is formed of impurity-doped polysilicon.

4. The method of claim 2, wherein the charge trapping layer is formed of a silicon nitride ($Si_3N_4$) layer, a nanocrystalline silicon layer, a nanocrystalline silicon germanium layer, a nanocrystalline metal layer, a nanocrystalline germanium layer, a tantalum oxide (TaO or $Ta_2O_5$) layer, an aluminum oxide ($Al_2O_3$) layer, a hafnium oxide ($HfO_2$) layer, a hafnium aluminum oxide (HfAlO) layer and/or a hafnium silicate nitride (HfSiON) layer.

5. A method of forming a nonvolatile memory, the method comprising:
    providing a semiconductor substrate including a cell array region, a high-voltage device region, a low-voltage device region, and a resistor region;
    forming a high-voltage gate insulation layer on the semiconductor substrate in the high-voltage device region;
    forming a low-voltage gate insulation layer on the semiconductor substrate in the low-voltage device region;
    forming a device isolation layer in the semiconductor substrate to define an active region;
    forming a first conductive layer on the high-voltage region, the low-voltage region, and the resistor region without forming the first conductive layer on the cell array region;
    forming a cell insulation layer on a portion of the semiconductor substrate including the cell array region and the first conductive layer and the resistor region;
    removing the cell insulation layer from the high-voltage device region and the low-voltage device region to expose the first conductive layer;
    forming a second conductive layer on the portion of the semiconductor substrate including the cell array region, the first conductive layer and the resistor region;
    patterning the second conductive layer in the cell array region to form a cell gate electrode while concurrently removing the second conductive layer from the resistor region; and patterning the second conductive layer and the first conductive layer in the high-voltage device region and the low-voltage device region to form a peripheral circuit gate electrode while patterning the first conductive layer in the resistor region to form a resistor.

6. The method of claim 5, wherein:

forming a cell insulation layer comprises conformally stacking a cell tunnel insulation layer, a charge trapping layer, and a cell blocking insulation layer over the entire upper surface of the portion of the semiconductor substrate including the cell array region and the first conductive layer and the resistor region;

removing the cell insulation layer comprises removing the cell blocking insulation layer, the charge trapping layer, and the cell tunnel insulation layer from the high-voltage device region and the low-voltage device region to expose the first conductive layer;

forming a second conductive layer comprises forming the second conductive layer over the entire upper surface of the portion of the semiconductor substrate including the cell array region, the first conductive layer and the resistor region;

patterning the second conductive layer comprises etching the second conductive layer in the cell array region to form the cell gate electrode and concurrently removing the second conductive layer from the resistor region; and patterning the second conductive layer and the first conductive layer comprises etching the second conductive layer and the first conductive layer in the high-voltage device region and the low-voltage device region to form the peripheral circuit gate electrode while etching the first conductive layer in the resistor region to form the resistor.

7. The method of claim 6, wherein the first conductive layer is formed of impurity-doped polysilicon.

8. The method of claim 6, wherein the charge trapping layer is formed of a silicon nitride ($Si_3N_4$) layer, a nanocrystalline silicon layer, a nanocrystalline silicon germanium layer, a nanocrystalline metal layer, a nanocrystalline germanium layer, a tantalum oxide (TaO or $Ta_2O_5$) layer, an aluminum oxide ($Al_2O_3$) layer, a hafnium oxide ($HfO_2$) layer, a hafnium aluminum oxide (HfAlO) layer and/or a hafnium silicate nitride (HfSiON) layer.

9. The method of claim 6, further comprising forming a third conductive layer over the entire upper surface of the semiconductor substrate before the removing of the cell blocking insulation layer, the charge trapping layer, and the cell tunnel insulation layer from the high-voltage device region and the low-voltage device region, wherein the third conductive layer is removed from the high-voltage device region and the low-voltage device region when the cell blocking insulation layer, the charge trapping layer, and the cell tunnel insulation layer are removed from the high-voltage device region and the low-voltage device region to expose the first conductive layer; and the third conductive layer is etched when the second conductive layer is etched to form a cell gate electrode at the cell array region and to expose the first conductive layer at the resistor region.

10. The method of claim 9, wherein the third conductive layer is formed of an impurity-doped polysilicon layer, a metal-containing layer, or a bi-layer including the impurity-doped polysilicon layer and the metal-containing layer.

11. The method of claim 6, wherein the second conductive layer is formed of a metal-containing layer or a bi-layer including the metal-containing layer and an impurity-doped polysilicon layer.

12. The method of claim 11, wherein the metal-containing layer is formed of a tantalum nitride (TaN) layer, a tantalum (Ta) layer, a tungsten silicide (WSi) layer, a cobalt silicide (CoSi) layer, a titanium silicide (TiSi) layer, a tungsten (W) layer, a tungsten nitride (WN) layer, a titanium (Ti) layer, a titanium nitride (TiN) layer, a titanium aluminum nitride (TiAlN) layer, a molybdenum (Mo) layer and/or a platinum (Pt) layer.

13. The method of claim 6, further comprising forming a fourth conductive layer over the entire upper surface of the portion of the semiconductor substrate before the forming of the device isolation layer, wherein the fourth conductive layer is also patterned when the peripheral circuit gate electrode is formed, so that the peripheral circuit gate electrode is a stack that includes the fourth conductive layer, the first conductive layer, and the second conductive layer.

14. The method of claim 13, wherein the fourth conductive layer is formed of impurity-doped polysilicon.

* * * * *